United States Patent [19]

Figal

[11] Patent Number: 5,030,905
[45] Date of Patent: Jul. 9, 1991

[54] BELOW A MINUTE BURN-IN

[75] Inventor: Timothy E. Figal, Fort Collins, Colo.

[73] Assignee: Hewlett-Packard Company, Palo Alto, Calif.

[21] Appl. No.: 362,898

[22] Filed: Jun. 6, 1989

[51] Int. Cl.$^5$ ............................................. G01R 1/02
[52] U.S. Cl. ............................ 324/158 R; 324/158 D; 324/158 F
[58] Field of Search .................... 371/21, 25.1, 28; 324/73 R, 73 AT, 158 R, 158 D, 158 F, 73.1

[56] References Cited

U.S. PATENT DOCUMENTS

| | | | |
|---|---|---|---|
| Re. 32,625 | 3/1988 | Schwarz et al. | 324/65 R |
| 3,748,579 | 7/1973 | Henry et al. | 324/158 D |
| 3,943,442 | 3/1976 | Fletcher et al. | 324/158 D |
| 4,420,722 | 12/1983 | Todd | 324/158 R |
| 4,483,629 | 11/1984 | Schwartz et al. | 324/158 R |
| 4,739,258 | 4/1988 | Schwarz | 324/158 R |
| 4,799,021 | 1/1989 | Cozzi | 324/158 R |
| 4,855,672 | 8/1989 | Shreeve | 324/158 R |

OTHER PUBLICATIONS

Evaluation Engineering, Sep. 1987, Wasson, James A., pp. 46-48.
Burn-In, Finn Jensen and Niels Erik Petersen, 12/1982, pp. 1-114, John Wiley Sons Ltd.
"Parallel Testing During Burn-In Boosts System Reliability," Electronics Test, Mar. 1987, Buck, Carl et al., pp. 48-53.
"Stress Screening for Improved Reliability," Evaluation Engineering, Feb. 1988, Shalroy, C. E., pp. 74-79.
"Combining Test with Burn In: An Examination of Benefits," Electronics Test, Sep. 1987, Phelps, L., pp. 55-58.
"A Realistic View of Burn-In," Evaluation Engineering, Feb. 1989, Hnatek, E. R., pp. 80-85.
"Cost-Effective ESS of Electronic Hardware", Evaluation Engineering, Feb. 1989, Jacob, G., p. 71.
"Burn-In and Stife Testing," Quality Progress, May 1986, Punches, Ki, pp. 93-94.
"IS Test During Burn-In the Answer", Evaluation Engineering, Jul. 1988, pp. 48-50.
"Conducting Burn-In Without Getting Burned," Electronics Test, May 1987, pp. 53-57, Young, David N.

Primary Examiner—Kenneth Wieder
Assistant Examiner—William J. Burns
Attorney, Agent, or Firm—Guy J. Kelley

[57] ABSTRACT

An electronic component test procedure which can employ a combination of stress, test, and sort techniques useful for consolidating package test, burn-in test and qualification tests. The process can be automated to avoid batch process and virtually eliminate manual handling. Components are sorted according to initial values and mathematical stress models.

30 Claims, 7 Drawing Sheets

BELOW A MINUTE BURN-IN

BACKGROUND OF THE INVENTION

1. Field of the Invention

The present invention pertains generally to an electronic component test process to screen for infant mortality.

2. Description of the Background

It is common for components to be exposed to stress testing. Most manufacturers stress test the component parts of their product in order to determine the life of the product in their customer environment, determine the mean time before failure (MTBF), and suitability of the product for its intended use.

Without stress testing, weak components would sort themselves out by early failure during use by the customer. The product manufacturer may still be liable for warranty and such a failure would require field service by the product manufacturer. Diagnosis and repair at a customer site can be extremely expensive. Even if the failure occurs beyond the warranty period of the product, if the product does not meet customer expectations then the customer becomes dissatisfied. This often results in loss of future sales for the product manufacturer. Dissatisfied customers communicate with other customers and potential customers. The experience of others will often induce a reluctance to purchase the products, resulting in loss of market share.

Electronic products have become complex with many components. The reliability of the resulting product is a function of the reliability of the components. In fact, the reliability is the mathematical product of the reliability of each of the components. For instance, if each component is 99% reliable for the first 1000 hours of operation and there are 100 components then the product is (0.99) to the 100 power, which is 36.6% reliable. This would mean that about two thirds of the final product would fail within 1000 hours of operation. Many electronic products have thousands of components, so to achieve the reliabilty required by customers, each component must have a very high reliability for a long period of time.

The reliability of a component or product can be depicted by the familiar bathtub curve. The bathtub curve is failure rate versus time. It has three regions: the early failures known as infant mortalities, the normal life failures where the reliability is usually the highest (lowest level of failures), and the wearout failures where reliability decreases and consequently failures increase. The goal is to remove all infant mortalities and deliver product to the customer which is in the normal life failure rate. The problem is that many infant mortalities occur after the component has passed a test sort. The component passes an initial test, but fails within a time span relatively soon afterward compared to the expected life of the product. Many electronic components like integrated circuits, semiconductor devices, fineline resistor networks, and thin film and thick film hybrids have expected operational lifetimes of 20 years or more with very high normal life reliability. This means that failures which occur within the first year are generally considered infant mortalities. Because of this, in order to sort out potential infant mortalities at normal operating conditions, it would require testing every part (not just sampling) for a long period of time, like one year. This is not practical and definitely not cost-effective for most electronic components.

Stress testing, also called burn-in or accelerated life test, was developed in order to shorten the length of time required to test components and sort out the potential early failures. Stress testing is a method to accelerate the life of the component. The theory is to expose the component to all the stresses it would experience in a shorter time. For example, a component that would operate for 1,000 hours before failing under normal conditions may fail in 20 hours if the amount of stress of the 1,000 hour period could be condensed into the 20 hours. There are various ways to condense the stress into a shorter period of time so that a component does not have to be tested for 1,000 hours to see if it meets the reliability requirements. There are also many theories about how much these different ways affect certain failure mechanisms so an acceleration factor can be derived either empirically or by calculation. BURN-IN by Finn Jensen and Niels Erik Petersen, published by John Wiley & Sons Ltd. 1982 discusses many of these theories and calculations.

Some of the ways to condense the stress are to exercise the component more frequently, raise or lower the operating temperature during operation, raise or lower the humidity, vibrate or shock the component, exercise the component with abnormal operating voltages and current, and many other adverse conditions and combinations of these intended to increase the stress in a short period of time compared to normal operating conditions, so as to mimic normal operating conditions for a long period of time. There are limits to the stress conditions. There are points for every condition in which by going beyond the limit, it ceases to be a mimic of normal operating conditions for a long period of time, but a short-term destructive episode. For example, the temperature is elevated to the point of combustion and the plastic package starts to burn. Clearly, a good part will last the required reliability expectations, but even a good part will catch fire when exposed to the temperature of combustion for one of its sub-components even if it would have lasted a very long time at temperatures just below the combustion temperature. Phase transitions and reaching activation energies for certain chemical processes change the model of life acceleration.

Also, manufacturers use the results of stress testing to calculate total ownership cost of the product to their customers, expected downtime, expected spare part inventory required in quantity and type, and expected economic lifetime of the product. At the development stage, stress testing is used to evaluate different components and make decisions between alternative designs and components.

After a design is determined, certain types of stress testing, nondestructive testing, are often used on components which will ultimately be incorporated into products going to customers. The purpose of performing stress tests at this step in the manufacturing process is to sort out the components which will fail before or soon after the product reaches the customer, components which do not meet the expected life or mean time before failure. In this case, it is important that the stress test does not weaken the component, but accurately sorts out the bad ones from the good ones. Tests which sort out all the bad ones, but also some good ones increase the manufacturing cost of the product, Type I error. Tests which only sort out most of the bad ones, but leave some bad ones classified as good, Type II error, increase the rework rate and reduce the reliability of the product.

In reality both Type I and II errors are present; most tests will sort out most of the bad components, leave some bad components classified as good and classify some good components as bad, thus increasing manufacturing costs from the ideal and reducing the reliability of the product from the ideal. This is not a perfect world, however stress testing is one of the processes used to approximate a perfect world.

For electronic components, stress testing is usually done at two different times in the life cycle of a component. The first time, development test, is when the component is first designed and the manufacurer of the component wants to determine whether the component meets expectations of design and manufacturability and to get an estimate on the potential yield of the component. The second time, qualification test, is after the manufacturer of the product receives the component from the component manufacturer when the product is being developed. The product manufacturer will do an incoming stress test on the component or more typically, do a stress test on the product or major portion of the product which will involve stressing the component along with other different components to determine whether the component suffices for the product's intended purpose. Next, the component manufacturer will perform production tests, sending only good parts to the product manufacturer. The product manufacturer may then, implement screening tests for particular characteristics to ensure high reliability.

Product manufacturers have been looking for less costly and time-consuming stress tests used at the qualification or screening test. Product manufacturers would like to eliminate stress testing, but maintain low failure rate product shipped to their customers. One method has been to try to educate the component manufacturer to deliver a component which does not need to be stress tested. Many improvements in component manufacture have happened. However, as the component reliability increases so does the customer expectations, so stress testing is not eliminated, but the acceptance criteria is changed to reflect the demand for higher quality parts. Moving the stress test from the product manufacturer to the end process of the component manufacturer can be a slight improvement since it reduces the communication channels and also places the stress test where the expertise is located with the component manufacturer. Many component manufacturers now perform a stress test as a standard processing step after their production tests and before shipping the component to the product manufacturer. However, since the stress test is still in the process, the cost and delay remains virtually the same. The component manufacturer's cost increases which are typically transferred to the product manufacturer's cost as prices the component manufacturer charges to the product manufacturer. The additional step of stress testing adds to the cost and fabrication time of the component. Up to now, package production test has not had the capability of finding as many reliability risks as stress testing finds, so this stress test is an additional test added to the production test of the component manufacturer.

One reason stress testing is costly and time consuming is that generally stress tests can last from 24 to 1,000 hours or more. Sometimes component stress testing is called burn-in. There are various burn-in methods. The oldest and simplest is static burn-in: prescreening test, elevated-temperature of component while the power supply pins are connected to a system controller so voltage can be applied, and post-test to eliminate failures due to the stress.

Next, dynamic burn-in was designed. The reason was to catch more bad parts than static burn-in and also increase the reliability of all parts. As products became more complex using more and more components, the level of reliability of a component which would pass a static burn-in would not be reliable enough. A more discriminating test like dynamic burn-in is required. The dynamic burn-in is similar to the static burn-in except during the elevated-temperature step along with applying voltage to the power supply pins, signals and voltages which exceed and stress the normal conditions are applied to the other pins of the component. One problem with the dynamic burn-in is that it is difficult to determine when a component fails. The burn-in must be interrupted and the components must be functionally tested in order to determine if there are any failures and which ones. Even testing at interrupt points only gives an approximation of the time of failure. Failure time is critical because it is used in constructing statistical models of reliability modes and rates like Weibull plots.

Another limtitation of the dynamic burn-in is the upper limit of test frequency. High frequencies generate spurious noise pulses. These noise pulses may invalidate applied signal levels. The high frequency input to one component may cause a spurious signal to another component. Actual test conditions are difficult to control at high frequencies.

A variation of the dynamic burn-in is to do a monitored burn-in. During dynamic burn-in, the inputs of the component under test (sometimes called device under test or DUT) are measured and compared to expected values in order to confirm the voltages and signals are at the pin and within specifications of the test. Sometimes this will be an indication of when a component fails, when an input cannot be held within range and the power supply to that pin limits out. However, even if the inputs can be held within predetermined limits, the component may not be functional.

Test during burn-in (TDBI) monitors the outputs and even performs a DC functional test during burn-in. This provides further information on when a component fails during burn-in. Doing a TDBI also eliminates the need to interrupt the stress conditions to perform periodic tests. This avoids the need of multiple ramping up and down of the environmental stress conditions. Since stress testing tends to be very long, anything which shortens the cycle time is useful.

Even with the evolution of stress testing from burn-in to TDBI, stress testing generally involves a batch process with a lengthy elevated-temperature time and operation of the component. Process times are reduced by reducing the number of times necessary to interrupt the stress test, increasing the batch size, increasing the number of components being monitored and tested, and refining life acceleration models so as to increase the stress and reduce time at stress.

A solution to further increase the reliability of the burn-in process was experimented with, in order to screen components in less than a minute per component test time, at the qualification test used at the product manufacturer site. This process is not a batch process, but a one component at a time process. This less than a minute screen test is a D.C. parameter and D.C. functional test for electronic components to reduce infant mortality rates and provide for a cost effective timely, but limited procedure to sort out bad components and pass good components. It comprises the steps of:

establishing a go/no go criteria using test limits established by trial and error from characterizing a particular group of components which fall within pass limits at normal operating temperature;

stabilizing the component at a temperature below test operating temperature and above normal operating temperature;

placing component in a test means for testing component;

heating the component package by an airflow and by conduction at a ramp rate of 100 degrees centigrade per minute to the test operating temperature;

performing multiple tests using normal operating voltages and putting bias voltages on the component for heating the component and to provide for test data measurements during the temperature ramp;

testing the component until the package temperature reaches a predetermined package thermal time constant away from temperature equilibrium;

ending the test after the component reaches thermal equlibrium at the test operating temperature;

determining whether the component is a good component using the go/no go criteria;

sorting the component so that a good component goes into a pass sort group and a bad component goes into a fail sort group.

This qualification test only provides a quick D.C. parameter and D.C. functional screen of components at high temperature.

Components which have low reliability due to A.C. parametrics, A.C. funtional, and high frequency effects may not be discovered with this test. This test would not be a substitute for the component manufacturer's package test. In order to sort out all the bad components, a complete package test needs to be done before this qualification test. This test is limited to the product manufacturer's site and is inadequate for a complete screen after component manufacture. Also, this test is inadequate for CMOS technology since D.C. does not heat the component enough to provide for sufficient induced stress. Since this test has broad acceptance limits, many reliability risks could be passed. A component's value may still be within the predetermined tolerance band, but the overall performance of the part with respect to the temperature curve may be abnormal, thus indicating a reliability problem.

Also, this test only used a temperature stress test. Because the activation energy in the oxide defect acceleration model is about 0.3, which is low, temperature does not accelerate oxide related defects very much. Temperature accelerates oxide defects about two to three times. This test is poor in screening oxide defects. Also, since this test was only an above normal operating temperature stress test, hot electron effects would not be observed. The high temperature "cures" hot electron effects.

This test was only a temperature ramp stress above normal operating temperature. The effects of only one ramp at high temperature are not representative of the component's thermal-mechanical-physical-electronic performance.

Burn-in has evolved and can provide much information on the reliability of the component, but through all the changes it has remained a screening to be done at the end of component manufacturing and at the beginning of product manufacturing. Burn-in has been an additional test to be performed on components which have passed prior tests. Burn-in has been so expensive and time-consuming that only ostensibly good parts are put into the process. At least two testing procedures have been required to avoid the cost and delay of processing as many bad parts as possible through burn-in.

The reason why stress testing has been limited to these two times has been time and cost. Generally, stress testing is long and costly, involving very specialized equipment to control and modify the surrounding environment along with special test and diagnostic equipment.

What is needed is a test method which can combine test, burn-in, and post burn-in test, thus eliminating multiple steps. However, a single process test must be able to have a high throughout so bad parts can be sorted economically at the same time potentially good parts are screened for infant mortality.

SUMMARY OF THE INVENTION

The present invention, Below a minute burn-in (Bambi), overcomes the limitations of the prior art by providing a method for testing electronic components, having D.C., A.C., high frequency, and high voltage characteristics, for reducing infant mortality rates and providing a cost effective timely procedure to sort out bad components and pass good components, for burn-in of electronic components having a nominal operating temperature, the method allows consolidation of package test, burn-in, and post burn-in test, the method eliminating lengthy burn-in batch processing, the method comprising the steps of:

stabilizing the component at a first temperature different than the nominal operating temperature and at a predetermined temperature difference from the test operating temperature;

placing the component in a test means for D.C. parameters, D.C. functional, and A.C. parameters or A.C. functional, or high frequency testing of the component;

measuring a first value of a parameter of the component at the first temperature;

ramping the temperature of the component to the test operating temperature;

measuring a second value of the parameter of the component at a second temperature;

comparing the first value to the second value.

Also, a voltage stress can be introduced, before measuring the first value, the method further comprising the step of biasing the component to a specified set of input voltage levels, and before measuring the second value, the method comprising the step of biasing the component to a second set of input voltage levels.

The comparing step comprises the steps of:

calculating an expected second value of the parameter from the measured first value;

calculating a range of the expected second value;

determining whether the measured second value is within the range of the expected second value.

The invention provides the advantage of incorporating test sort and burn-in because of applying large stresses over a short period of time while exercising the component and comparing actual measurements with expected measurements. The expected measurements are calculated for each component from the first actual measurement and the models for the particular stresses applied as a function of temperature. A first sort can be done by comparing the first actual measurement with a predetermined specification range. A second sort can be done substantially simultaneously while the part is still positioned in the test apparatus. The second sort, the burn-in sort, is done by comparing a second or third or subsequent actual measurement with a calculated specification range. The calculated specification range is derived from the first actual measurement as a function of the model of the stresses imposed on the component, voltage, frequency, and temperature. Another advantage is the ability to detect more oxide defects which cause more reliability failures. A further advantage is that this invention can be fully automated. No batch processing is required. Handling the components is minimized. Very high frequency (over 100 MHz) burn-in is possible with this invention which more closely simulates actual use conditions.

DETAILED DESCRIPTION

Figure 1:
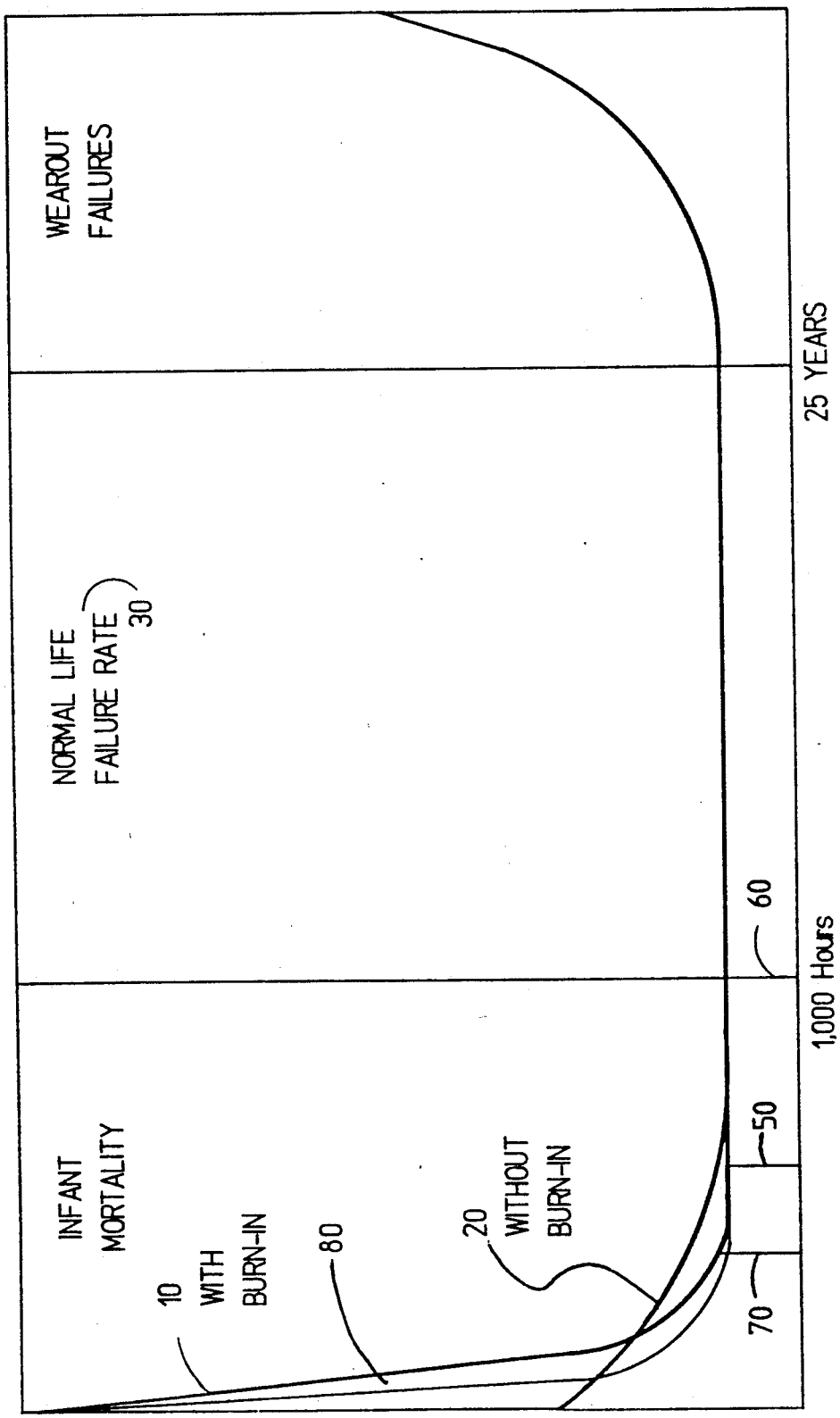
FIG. 1 illustrates the bathtub curve of reliability.

FIG. 1 shows the bathtub reliability curve. Burn-in curve 10 approaches the normal life failure rate 30 much faster than components which have received no burn-in on curve 20. In this way, manufacturer's warrant periods can be shortened and projected warranty costs can be estimated more accurately over the shorter warranty period. With burn-in, most of the failures can be induced by burn-in during the period the product is still with the manufacturer. The point 60 is the time it takes to find all of the infant mortalities without burn-in. With burn-in, the point 50 marks approximately the time period, within one time constant, it takes to find all of the infant mortalities. It is generally expensive and usually impractical to exercise a component or product for the length of time it would take to find all of the infant mortalities before sending the product to the customer. By using burn-in techniques, the length of time required to exercise the component or product in order to find all of the infant mortalities is reduced and can be reduced to such an extent that it is feasible and practical to burn-in the product and find most if not all infant mortalities. Depending on the burn-in procedure used, the time period to come within one time constant of finding all of the infant mortalities varies. Prior burn-in procedures have taken from 1000 hours to several hundred hours. Bambi (80) takes from about 1 hour to 20 hours depending the number of components to be tested, implementation, test coverage, and the product environment being tested for. Bambi significantly reduces the time required to find substantially all of the infant failures.

Figure 2:
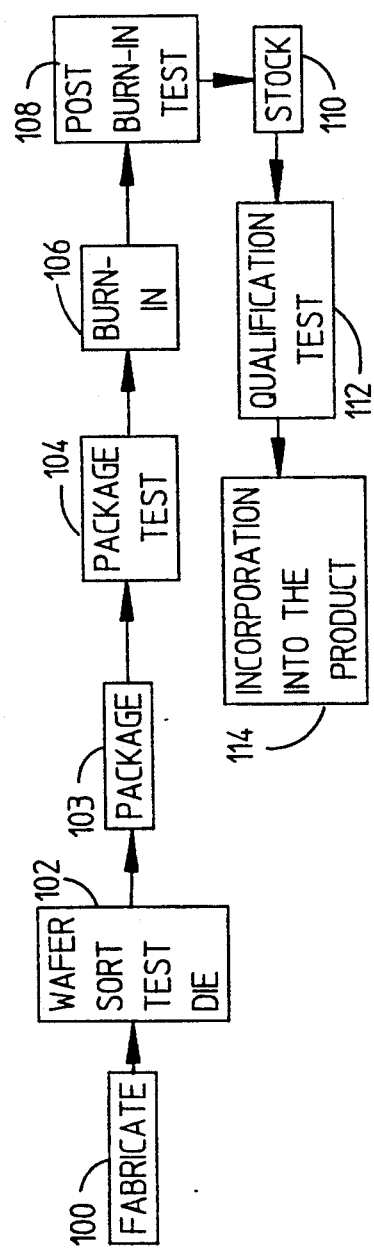
FIG. 2 is a schematic of a typical electronic manufacturing process.

FIG. 2 shows the prior art process sequence. The component is fabricated at step 100. Next, all of the components are tested and sorted into functional and non-functional components to avoid the expense of packaging non-functional components. Typical yields can be 10% to 90% depending on the size and complexity of the component. The functional components are sent on to packaging 103. After package 103, the components are subjected to a package test to sort out good components from bad components. Sometimes package test includes tests which could not have been done accurately at wafer sort die test 102. Typical package test yields are 90% to 100%. After package test 104, a burn-in is done to induce infant mortalities; functional parts that will soon fail because of an inherent weakness in its fabrication not normally found. This burn-in has been a batch processing, sometimes hundreds of parts are put into an environmentally controlled chamber. As discussed in the background, the burn-in can also be monitored and a test during burn-in can also be incorporated. After burn-in 106, even if monitored or a test during burn-in incorporated, typically a post burn-in test 108 is done. After post burn-in test 108, the components are put into stock, shipped to the product manufacturer, or directly assembled into the product.

Sometimes another test is done after the component has been shipped to the product manufacturer. This is sometimes called a component qualification test 112, which is done just before the component is assembled into the product. The reason for a qualification test is to further improve the reliability of the component for the particular product it will go into. This may be because the product has peculiar stress and component requirements for which it has not been previously tested or screened. It may be because the product manufacturer wants better reliability than what the component manufacturer can deliver and it is worth it to the product manufacturer to make further tests.

Stress testing can be done at the qualification test 112. Typically this has also been a batch test with a single component at a time post qualification burn-in test. However, a one step qualification test doing one component at a time has been developed and used in the prior art. This method is for D.C. parametric and D.C. functional testing electronic components using an HP 5045 tester for post burn-in test to reduce infant mortality rates and provide for a cost effective timely procedure to sort out bad components and pass good components. The test comprises the steps of: 1) establishing a go/no go criteria using empirically derived test limits established by trial and error from characterizing a particular group of components which fall within pass limits at normal operating temperature; 2) stabilizing the component at a temperature below test operating temperature; 3) placing component in a test means having a test site heater for testing component; 4) heating the component package by an airflow and by the test site heater at a rate of 100 to 300 degree centigrade per minute; 5) heating the component by performing multiple tests using normal operating voltages and applying normal operating bias voltages to the component; 6) multiple testing of the component until the package is within a predetermined thermal time constant of the internal die at the test operating temperature; 7) determining whether component is a good component using the go/no go criteria; 8) sorting the component so that a good component goes into a pass sort group and a bad component goes into a fail sort group. This process combined the single-component-at-a-time used at the package test with the stress conditions used at the burn-in step. This test was limited because it only provided a gross screen for D.C. parameter and D.C. functionals and sorting was done with respect to historical data of ostensibly good parts and not relative to the individual component value and its projected value under stress conditions. This sort would pass bad parts (Type II error) for at least these reasons, the components were not tested for A.C. parameter and A.C. functionals, the components were not tested at high frequency, the components were not subjected to a voltage stress in combination with the environmental stress of temperature and humidity, temperature cycle/shock, and the component stress values were not compared to the initial values of the component, but only compared to an historical range derived from values obtained from previous testing.

Figure 3:
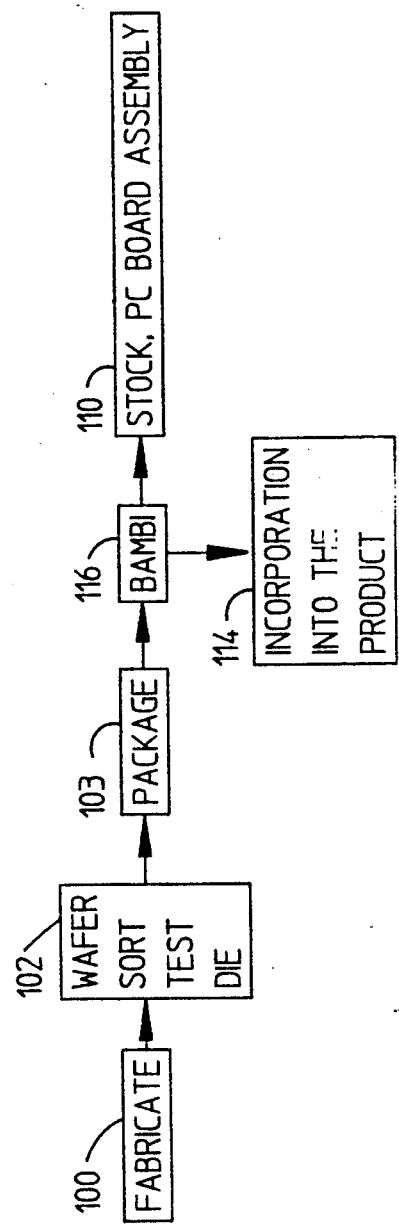
FIG. 3 displays the manufacturing sequence incorporating Below A Minute Burn-In (Bambi).

FIG. 3 shows one implementation of the invention which allows the consolidation of package test 104, burn-in 106, post burn-in test 108, and product manufacturer qualification test 112. This process uses the Schlumberger Sentry-15 tester to perform A.C. parameter and A.C. functional test, D.C. parameter and D.C. functional test, voltage stress, and high frequency test. Any equivalent tester could be used, for example, the HP 82000, Teradyne, or Megatest. All the tests can be performed while various stresses of temperature and voltage are superimposed. Bambi is a single component at a time process. Bambi is a serial test for one component, but multiple Bambi processes can be done with multiple components in parallel. Since Bambi is not a batch process, it can be automated. This reduces handling and reduces failures induced by handling and manual processing.

Bambi can also be implemented at the wafer level test called wafer sort test die 102. At the wafer level, the die is not yet packaged and is still in wafer form. Typically, there are hundreds to thousands of identical die on each wafer. The number of die per wafer depends on the size of the wafer and the size of the individual die. The wafer level tester would test each die using the Bambi method. This allows the rejection of low reliability die before the expense of packaging the die is incurred. The costs of assembly and packaging the die can be 50-75% of the cost of the component. A burn-in method which can be implemented at the wafer level, before packaging, can provide significant savings depending on the reliability required for the component and the proportion of reliability failures that would be packaged if not found at the wafer level.

Figure 4:
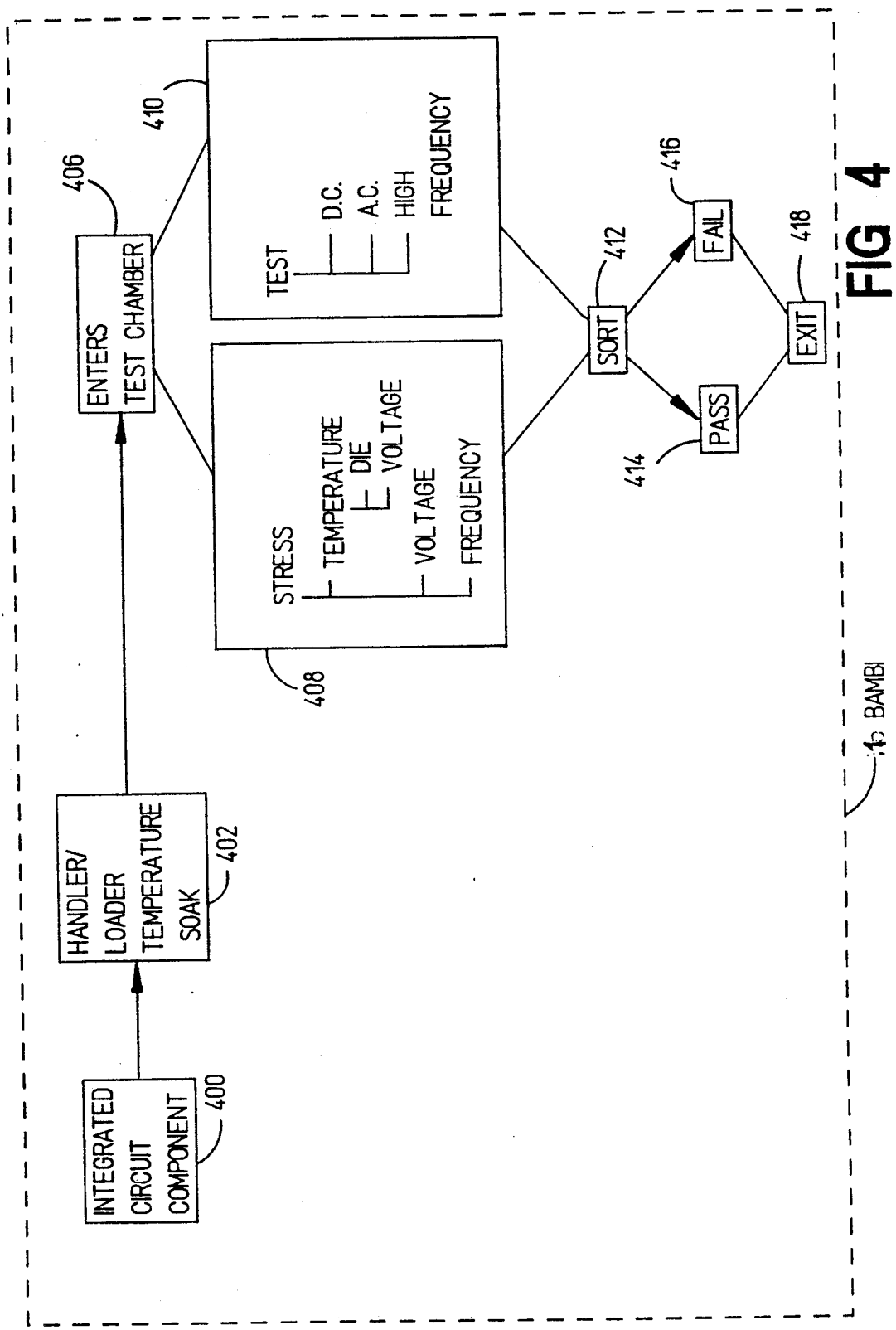
FIG. 4 illustrates one embodiment of the invention by showing the sequence of processing steps.

FIG. 4 shows each step in an embodiment of the test method. The integrated circuit component 400 is loaded into an IC handler/loader 402 designed to heat the component to just below the final test temperature and queue the component into the test site. The IC handler/loader loads the component into the test chamber 406. Substantially simulataneously, the component is repeatedly tested 410 for D.C. parameter and D.C. functionals, A.C. parameter and A.C. functionals, and high frequency, during which stresses are applied 408. Stresses are applied 408; the temperature is being ramped up, generally between 100 to 300 degrees centigrade per minute, and voltage and high frequency step stresses are periodically introduced. Sorting 412 can take place even during the test/stress process. The resulting test values are correlated with respect to the stress being experienced by the component. These are compared to expected values calculated as a function of the initial values of the test and the value of the stress being experienced by the component. This comparison can be done with intermediate test values while the test/stress is generating subsequent values. In fact, the comparison may result in a sort fail 416 before a complete test is done if an intermediate value fails the comparison. After testing, the component exits 418 the test chamber and is separated into pass and fail bins depending on the component performance during the testing and comparison to expected values.

Figure 5:
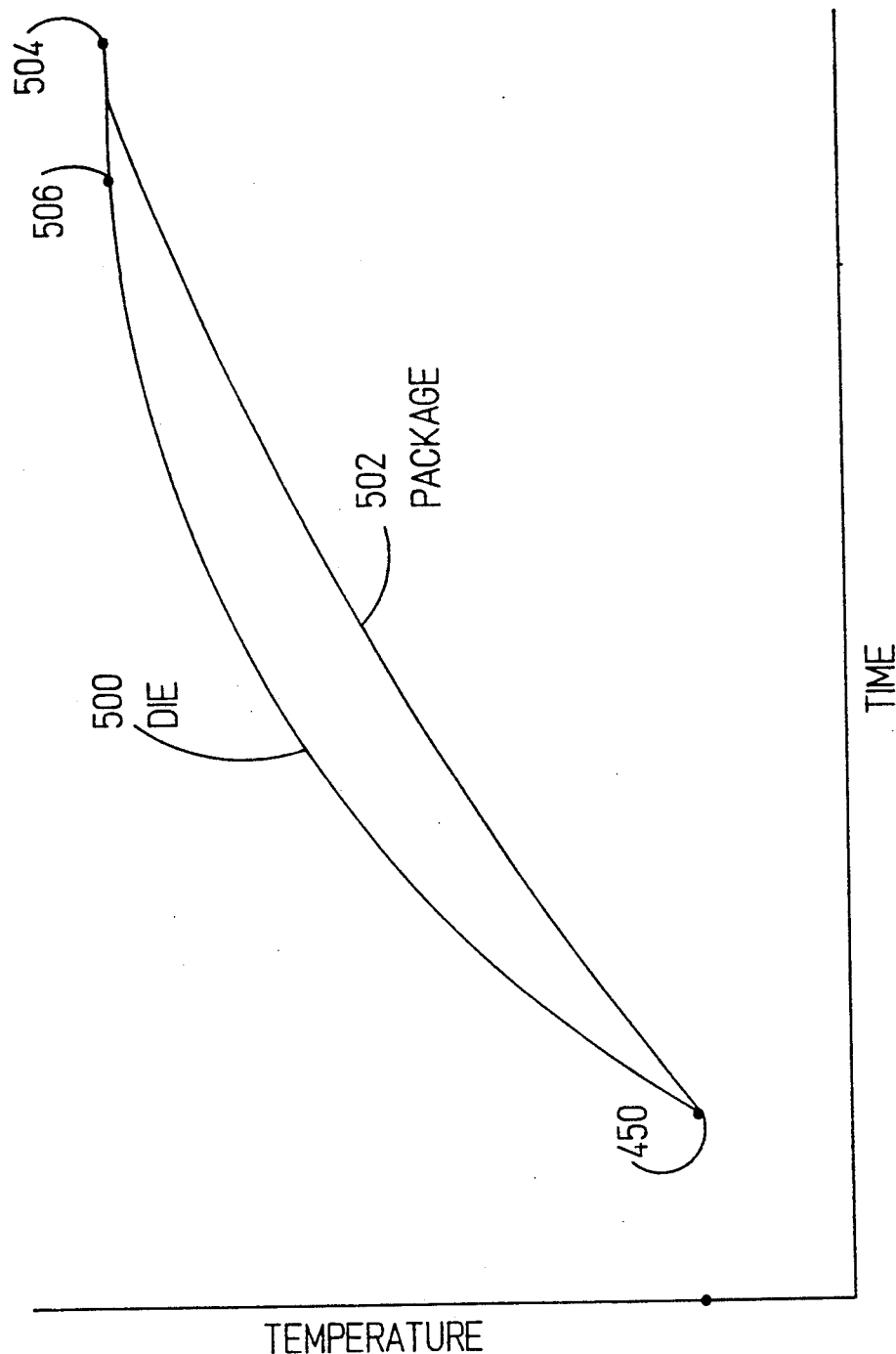
FIG. 5 shows the temperature rise difference between the die and the package of the component.

FIG. 5 compares the temperature rise of the die 500 to the package 502 when both parts of the component start at the same temperature, the temperature soak 450 at the loader/handler 402. The die 500 heats up faster than the package because of the multiple electrical tests and stresses being directly imposed upon the die. The package heats up from the air flow heat of the test system and by conduction from the die 500. At some point equilibrium 504 is reached when the die and package are at the same temperature. The multiple test/stress continues until the equilibrium 504 or until the temperature of the package is within a predetermined thermal time constant 506 from the equilibrium point 504. The temperature rise, that is, the slope of 500 during the test, is 100 to 300 degrees centigrade per minute.

Figure 6:
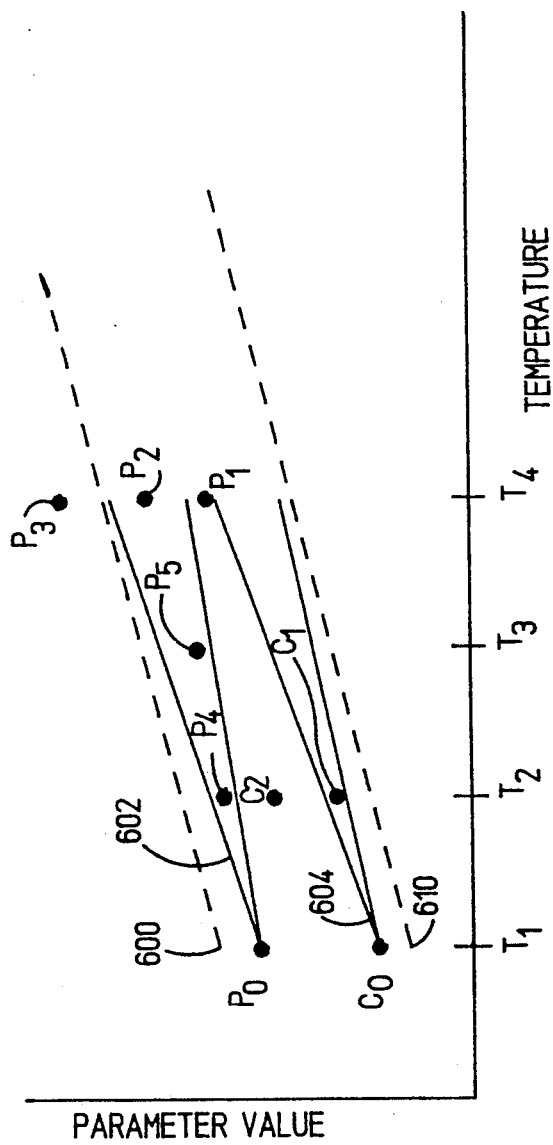
FIG. 6 illustrates the comparison steps in order to perform a sort into good and bad parts.

FIG. 6 is a specific example how a comparison between measured values and expected values is done. Two sorting schemes are shown: go/no go limits are shown by the range 600 to 610 and the relative comparison scheme is shown by 602 and 604. The curve 600,610 is generated by historical data of known good parts. The curves 602 and 604 are generated from the points P0 and C0 respectively and a model of the stress being applied and the parameter being measured. This example shows two sets of potential parameter values, set P and set C. Set P shows what can happen as one stress condition, temperature, changes during the test. A first test is done and an initial parameter value P0 is obtained. From P0, a mathematical surface is generated as a function of the stress involved and the relationship to the test P. At a second temperature, T2, another test is done with P4 as the value. Since P4 lies on the surface generated by P0, it is an acceptable value and the component passes this test for this stress value T2. A third test is done with P5 still laying on the surface at T3. At T4, three possibilities are illustrated in order to show the difference between the prior art and the invention. If P3 were obtained, since P3 does not fall within the specification range 600, 610 and lies above 600, and also, it does not lie on the mathematical curve 602 generated by P0, the component would fail under both sorting schemes. However, both P1 and P2 would pass using historically derived specifications. Since P1 lies outside of the mathematical curve 602 generated by P0, the component would fail and is potentially a reliability risk that would not have been observed using prior techniques. It should be noted, only one value, P1, P2, or P3 would be obtained. All three points are drawn merely to illustrate the different sorting effects resulting from each.

Test C shows that a fail can occur at any time during the stress conditions. With BAMBI sorting technique, it is not necessary to wait until a value is obtained which is outside of the specification limits 600, 610. If C2 is obtained, even though it is within the specification limits the component presents a reliability risk since C2 lies outside of the mathematical curve 604 generated by C0. The test can end at the intermediate value C2. No further measurements at T3 and T4 need to be taken.

The curves in FIG. 6 are drawn as linear curves with respect to temperature. This is merely done for ease of illustration and understanding. The limits and expected values could be nonlinear. Indeed, the parameter value axis could be a logarithmic scale (base e, 10, or some other number), so the curves appear linear and are easily drawn on standard graphs.

Figure 7:
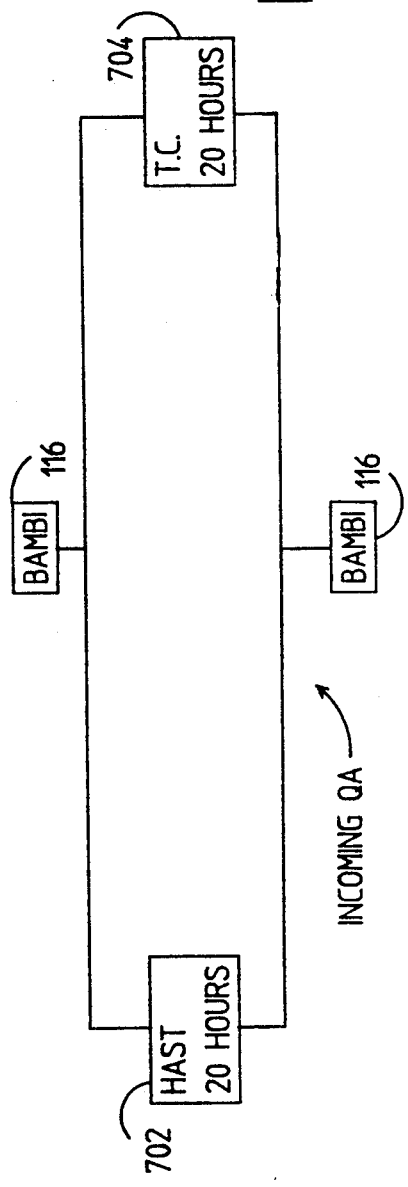
FIG. 7 illustrates another embodiment of the invention.

FIG. 7 shows another implementation of Bambi. Bambi could be put into an incoming quality assurance (QA). First, the components are processed through Bambi. The components are split up and only a sample from the lot are put through either a Highly Accelerated Stress Test (HAST) 702 or a Temperature Cycle (TC) 704 for twenty hours. The HAST test is a moisture resistance test, performed at various humidities and temperatures while the component is under static bias. Another way of viewing HAST is to consider it an accelerated 85/85 (85 degrees centigrade at 85% relative humidity) moisture resistance test. TC is cycling the component between two temperature extremes (generally very hot, 150 degrees centigrade and very cold, minus 55 degrees centigrade) without the component under bias, all pins are floating. After this, the components are processed through Bambi 116 again.

Figure 8:
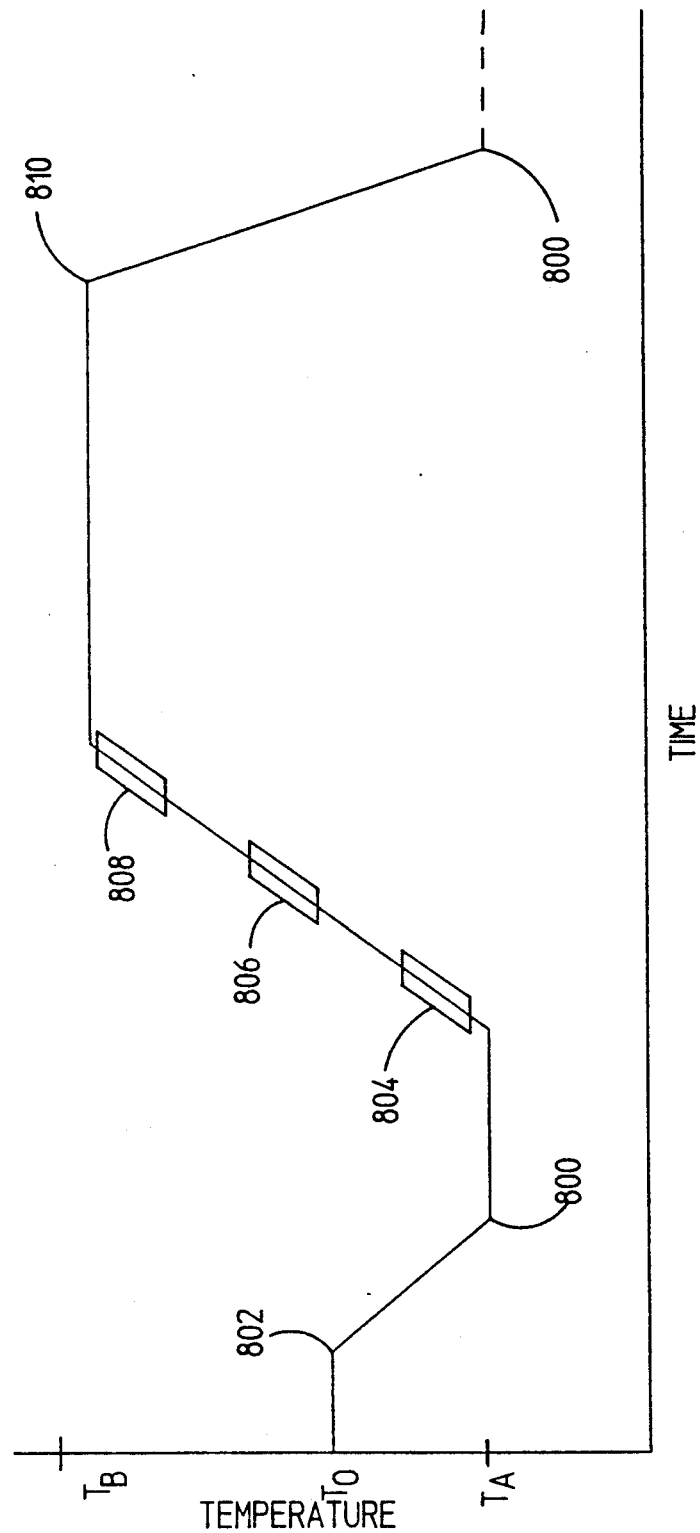
FIG. 8 is a graph illustrating an embodiment of Bambi using a first temperature below the normal operating temperature of the component.

FIG. 8 illustrates a version of the Bambi process where the first test temperature 800 is below the normal operating test temperature of the component and below room temperature 802. The initial temperature soak 402 before going into the test chamber is a cooling temperature ramp. During the period 804, the Bambi process steps 408 through 412 are done. Another set of stress/tests 408 through 412 can be done for other periods, 806 and 808. This example shows three such periods. Any multiple of periods could be done including having one period which extended over most of the temperature rise. Each period would be a complete stress/test and multiple values could be taken within each period. The sort would take place within a period 804, and not necessarily between two periods 804 and 806. Also, Bambi may employ more than one of these temperature cycles. At point 810, the component could be placed into the temperature soak again in order for the component to reach temperature point 800. The component would then be ready to start another series of 804 through 808.

This version could be substantially fully automated. Loader/handlers/temperature soaks 402 and testers 406 could be aligned in series so multiple cycles could proceed uninterrupted by manual processing. Also, loaders 402 and testers 406 can be aligned in parallel in order to increase capacity.

Figure 9:
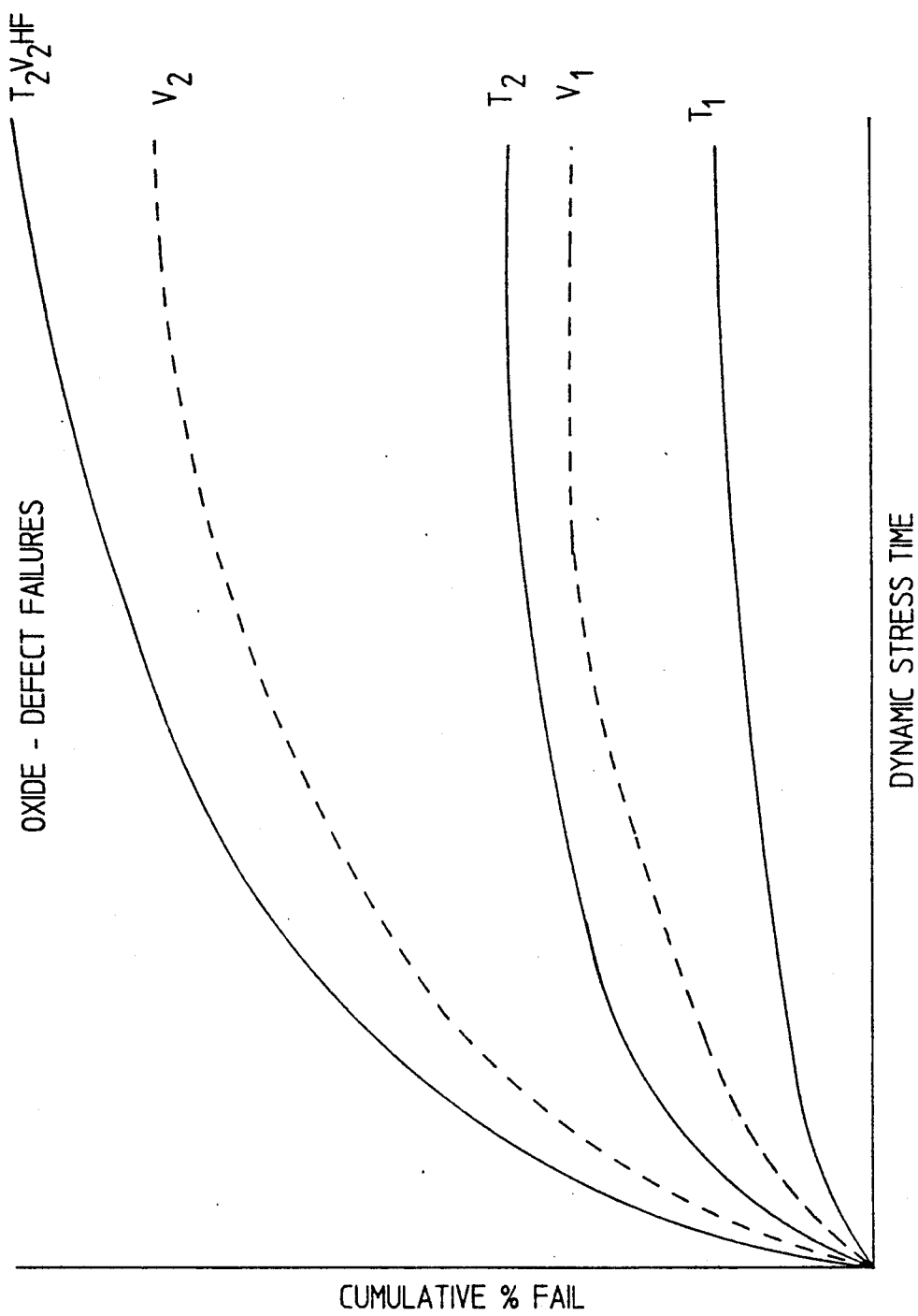
FIG. 9 illustrates the relative acceleration of oxide-defect failures due to increasing the temperature as compared to the relative acceleration of oxide-defect failures due to increasing the voltage bias input to the component.

FIG. 9 shows the benefits of Bambi in detecting oxide defects. By using a voltage stress V1 to V2, oxide defects are accelerated to a greater extent than by using temperature T1 to T2 alone. The activation energy in the Arrhenius equation [time=temperature-independent constant*exponential(activation energy/Boltzmann's constant*absolute temperature)] for oxide defects is small with respect to temperature increases as compared to voltage increases. The combination of temperature, voltage, and high frequency stress even further accelerates infant failures due to oxide defects. This is given by the Eyring equation: component hazard rate=constant A* [exponential(constant B/Boltzmann's constant*absolute temperature)]*[exponential(stress value of voltage and high frequency*(constant C+constant D/Boltzmann's constant*absolute temperature))]. Different stresses have different activation energies on a given defect. Also, the interaction between stresses can accelerate the lifetime of the defect so the defect causes a failure sooner than at normal operating conditions.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A method for testing electronic components having a normal operating temperature, at a test operating temperature, for reducing infant mortality rates and for providing a cost effective timely procedure to sort out bad components and pass good components, the method comprising the steps of:

stabilizing the component at a first temperature different than the normal operating temperature and at a predetermined temperature difference from the test operating temperature;

placing the component in a test means for testing the component;

measuring a first value of a parameter of the component at the first temperature;

based upon the measured first value, calculating an expected second temperature parameter value;

calculating a range of the expected second temperature parameter value;

ramping the temperature of the component;

measuring a second value of the parameter of the component at a second temperature;

comparing the measured second temperature parameter value to the expected second temperature parameter value;

determining whether the measured second temperature parameter value is within the calculated range of the expected second temperature parameter value.

2. The method of claim 1 wherein a voltage stress is introduced, before measuring the first value, the method comprising the step of biasing the component to a specified set of input voltage levels, and before measuring the second value, the method comprising the step of biasing the component to a second set of input voltage levels.

3. The method of claim 1 wherein the first temperature is absolutely above the normal operating temperature of the component and the second temperature is absolutely higher than the first temperature.

4. The method of claim 3 wherein a third value of the parameter is measured at a third temperature and compared to an expected third temperature value having a different range for comparison.

5. The method of claim 4 wherein the range is a statistical error calculated from the first value having a first uncertainty associated therewith and the second value having a second uncertainty associated therewith.

6. The method of claim 1 wherein the range is a statistical error calculated from the first value having a first uncertainty associated therewith and the second value having a second uncertainty associated therewith.

7. The method of claim 1 wherein the parameter of the component is a high frequency parameter and before each measuring step the method comprises the step of supplying a high frequency input signal to the component.

8. The method of claim 1 wherein the parameter of the component is an A.C. parameter and before each measuring step, the method comprises the step of supplying an A.C. input signal to the component.

9. The method of claim 1 wherein the first temperature is absolutely below the normal operating temperature and the second temperature is absolutely above the first temperature.

10. A method for testing electronic components having a normal operating input voltage bias, to reduce infant mortality rates and provide for a cost effective timely procedure to sort out bad components and pass good components, the method comprising the steps of:
   placing the component in a test means for testing the component;
   biasing the component to a specified set of input voltage levels;
   measuring a first value of a parameter of the component at a first test operating input bias voltage;
   based upon the measured first value, calculating an expected second value of the parameter;
   calculating a range of the expected second parameter value;
   biasing the component to a second set of input voltage levels;
   measuring a second parameter of the component;
   comparing the measured second parameter to the expected second parameter value;
   determining whether the measured second parameter value is within the predetermined range of the expected second parameter value.

11. The method of claim 10 further comprising comparing the first measured value to a first set of go/no go limits established by historical data and by comparing the second measured value to a second set of go/no go limits established by historical data.

12. A method for testing electronic components having a normal operating input voltage bias, to reduce infant mortality rates and provide for a cost effective timely procedure to sort out bad components and pass good components, the method comprising the steps of:
   placing the component in a test means for testing the component;
   biasing the component to a specified set of input voltage levels;
   measuring a first value of a parameter of the component at a first test operating input bias voltage;
   based upon the measured first value, calculating an expected second value of the parameter;
   calculating a range of the expected second parameter value;
   biasing the component to a second set of input voltage levels;
   measuring a second parameter of the component;
   comparing the measured second parameter to the expected second parameter value;
   determining whether the measured second parameter value is within the predetermined range of the expected second parameter value;
   comparing the first measured value to a first set of go/no go limits established by historical data and by comparing the second measured value to a second set of go/no go limits established by historical data;
   wherein the test parameter being measured comprises an A.C. parametric and A.C. functional measurement.

13. A method for testing electronic components having a normal operating input voltage bias, to reduce infant mortality rates and provide for a cost effective timely procedure to sort out bad components and pass good components, the method comprising the steps of:
   placing the component in a test means for testing the component;
   biasing the component to a specified set of input voltage levels;
   measuring a first value of a parameter of the component at a first test operating input bias voltage;
   based upon the measured first value, calculating an expected second value of the parameter;
   calculating a range of the expected second parameter value;
   biasing the component to a second set of input voltage levels;
   measuring a second parameter of the component;
   comparing the measured second parameter to the expected second parameter value;
   determining whether the measured second parameter value is within the predetermined range of the expected second parameter value;
   comparing the first measured value to a first set of go/no go limits established by historical data and by comparing the second measured value to a second set of go/no go limits established by historical data;
   wherein before the step of measuring the first measurement, the step of applying a high frequency to an input of the component; also, the test parameter being measured comprises a high frequency parameter.

14. The method of claim 10 wherein a third value of the parameter is measured at a third set of input voltage levels and compared to an expected third value having a different range for comparison.

15. A method for testing electronic components having a normal operating input voltage bias, to reduce infant mortality rates and provide for a cost effective timely procedure to sort out bad components and pass good components, the method comprising the steps of:
   placing the component in a test means for testing the component;
   biasing the component to a specified set of input voltage levels;
   measuring a first value of a parameter of the component at a first test operating input bias voltage;
   based upon the measured first value, calculating an expected second value of the parameter;
   calculating a range of the expected second parameter value;
   biasing the component to a second set of input voltage levels;
   measuring a second parameter of the component;

comparing the measured second parameter to the expected second parameter value;
determining whether the measured second parameter value is within the predetermined range of the expected second parameter value;
wherein a third value of the parameter is measured at a third set of input voltage levels and compared to an expected third value having a different range for comparison;
wherein the range is a statistical error calculated from the first value having a first uncertainty associated therewith and the second value having a second uncertainty associated therewith.

16. A method for testing electronic components having a normal operating input voltage bias, to reduce infant mortality rates and provide for a cost effective timely procedure to sort out bad components and pass good components, the method comprising the steps of:
placing the component in a test means for testing the component;
biasing the component to a specified set of input voltage levels;
measuring a first value of a parameter of the component at a first test operating input bias voltage;
based upon the measured first value, calculating an expected second value of the parameter;
calculating a range of the expected second parameter value;
biasing the component to a second set of input voltage levels;
measuring a second parameter of the component;
comparing the measured second parameter to the expected second parameter value;
determining whether the measured second parameter value is within the predetermined range of the expected second parameter value;
wherein the range is a statistical error calculated from the first value having a first uncertainty associated therewith and the second value having a second uncertainty associated therewith.

17. A method for testing electronic components having a normal operating input voltage bias, to reduce infant mortality rates and provide for a cost effective timely procedure to sort out bad components and pass good components, the method comprising the steps of:
placing the component in a test means for testing the component;
biasing the component to a specified set of input voltage levels;
measuring a first value of a parameter of the component at a first test operating input bias voltage;
based upon the measured first value, calculating an expected second value of the parameter;
calculating a range of the expected second parameter value;
biasing the component to a second set of input voltage levels;
measuring a second parameter of the component;
comparing the measured second parameter to the expected second parameter value;
determining whether the measured second parameter value is within the predetermined range of the expected second parameter value;
wherein the parameter of the component is a high frequency parameter and before each measuring step the method comprises the step of supplying a high frequency input signal to the component.

18. A method for testing electronic components having a normal operating input voltage bias, to reduce infant mortality rates and provide for a cost effective timely procedure to sort out bad components and pass good components, the method comprising the steps of:
placing the component in a test means for testing the component;
biasing the component to a specified set of input voltage levels;
measuring a first value of a parameter of the component at a first test operating input bias voltage;
based upon the measured first value, calculating an expected second value of the parameter;
calculating a range of the expected second parameter value;
biasing the component to a second set of input voltage levels;
measuring a second parameter of the component;
comparing the measured second parameter to the expected second parameter value;
determining whether the measured second parameter value is within the predetermined range of the expected second parameter value;
wherein the parameter of the component is an A.C. parameter and before each measuring step, the method comprises the step of supplying an A.C. input signal to the component.

19. A method for burn-in of electronic components having a nominal operating temperature, the method allowing consolidation of package test, burn-in, and post burn-in test, the method eliminating lengthy burn-in batch processing, the method comprising the steps of:
stabilizing the component at a first temperature different than the nominal operating temperature and at a predetermined temperature difference from the test operating temperature;
placing the component in a test means for high frequency parametric testing of the component;
measuring a first value of a parameter of the component at the first temperature;
ramping the temperature of the component;
measuring a second value of the parameter of the component at a second temperature;
comparing the first value to the second value.

20. The method of claim 19 wherein a voltage stress is introduced, before measuring the first value, the method comprising the step of biasing the component to a specified set of input voltage levels, and before measuring the second value, the method comprising the step of biasing the component to a second set of input voltage levels.

21. The method of claim 19 wherein the comparing step comprises the steps of:
calculating an expected second value of the parameter from the measured first value;
calculating a range of the expected second value;
determining whether the measured second value is within the range of the, expected second value.

22. The method of claim 21 wherein a voltage stress is introduced, before measuring the first value, the method comprising the step of biasing the component to a specified set of input voltage levels, and before measuring the second value, the method comprising the step of biasing the component to a second set of input voltage levels.

23. A method for testing electronic components, having a die and a package, having a normal operating temperature, at a test operating temperature, for reducing infant mortality rates and for providing a cost effective timely procedure to sort out bad components and pass good components, the method comprising the steps of:

a. stabilizing the component at a first temperature below the absolute normal operating temperature and at a predetermined temperature difference from the test operating temperature;
b. placing the component in a test means for testing component;
c. biasing the component to a specified set of input voltage levels
d. measuring a first value of a parameter of the component at the first temperature;
e. calculating an expected second temperature parameter value;
f. calculating a range of the expected second temperature parameter value;
g. ramping the temperature of the component to a larger absolute temperature;
h. biasing the component to a second set of input voltage levels
i. measuring a second value of the parameter of the component at a second temperature;
j. comparing the first value to the second value;
k. determining whether measured first parameter value is within a predetermined range of the expected second temperature parameter value:
l. repeating steps c–k a plurality of times until the die temperature and the package temperature are within a predetermined thermal time constant of a predetermined test operating temperature;
m. waiting a predetermined time period;
n. repeating steps c–m a plurality of times until a predetermined final above normal test operating temperature is reached in step 1 for the predetermined test operating temperature.

24. The method of claim 23 wherein the method comprises a step after n of:
o. repeating steps a–n a predetermined plurality of times.

25. The method of claim 24 wherein the parameters to be measured are high frequency parameters, AC parameters, and AC functionality.

26. The method of claim 25 wherein the method comprises the steps of;
performing steps a–o;
performing a high acceleration stress test (HAST); and
performing steps a–o.

27. The method of claim 2, wherein the method comprises the steps of;
performing steps a–o;
performing a temperature cycle test (TC); and
performing steps a–o.

28. A method for testing an electronic component in wafer form, the wafer having a plurality of components called die, having a normal operating temperature, at a test operating temperature, for reducing infant mortality rates and for providing a cost effective timely procedure to sort out bad components and pass good components, the method comprising the steps of:

a. stabilizing the component at a first temperature below the absolute normal operating temperature and at a predetermined temperature difference from the test operating temperature;
b. placing the component in a test means for testing component;
c. biasing the component to a specified set of input voltage levels
d. measuring a first value of a parameter of the component at the first temperature;
e. calculating an expected second temperature parameter value;
f. calculating a range of the expected second temperature parameter value;
g. ramping the temperature of the component to a larger absolute temperature;
h. biasing the component to a second set of input voltage levels
i. measuring a second value of the parameter of the component at a second temperature;
j. comparing the first value to the second value;
k. determining whether measured first parameter value is within a predetermined range of the expected second temperature parameter value:
l. repeating steps c–k a plurality of times until the die temperature is within a predetermined thermal time constant of a predetermined test operating temperature;
m. waiting a predetermined time period;
n. repeating steps c–m a plurality of times until a predetermined final above normal test operating temperature is reached in step 1 for the predetermined test operating temperature.

29. The method of claim 28 wherein the method comprises a step after n of:
o. repeating steps a–n a predetermined plurality of times.

30. The method of claim 29 wherein the parameters to be measured are high frequency parameters, AC parameters, and AC functionality.

* * * * *